US008299482B2

(12) United States Patent
Ng et al.

(10) Patent No.: US 8,299,482 B2
(45) Date of Patent: Oct. 30, 2012

(54) LIGHT EMITTER

(75) Inventors: Keat Chuan Ng, Bayan Lepas (MY); Lig Yi Yong, Simpang Ampat (MY); Kheng Leng Tan, Gelugor (MY)

(73) Assignee: Intellectual Discovery Co., Ltd., Seoul (KR)

( * ) Notice: Subject to any disclaimer, the term of this patent is extended or adjusted under 35 U.S.C. 154(b) by 430 days.

(21) Appl. No.: 12/573,675

(22) Filed: Oct. 5, 2009

(65) Prior Publication Data

US 2011/0079802 A1 Apr. 7, 2011

(51) Int. Cl.
*H01L 33/00* (2010.01)

(52) U.S. Cl. ............... 257/98; 257/706; 257/E33.067; 257/E23.04

(58) Field of Classification Search ............... 257/98, 257/667, 675, 706, 707, E33.067, E23.04
See application file for complete search history.

(56) References Cited

U.S. PATENT DOCUMENTS

| 6,251,707 | B1 | 6/2001 | Bernier et al. |
| 7,196,403 | B2 | 3/2007 | Karim |
| 7,276,394 | B2 | 10/2007 | Waldman et al. |
| 2004/0036081 | A1* | 2/2004 | Okazaki ............... 257/99 |
| 2009/0152691 | A1 | 6/2009 | Nguyen et al. |

OTHER PUBLICATIONS

Hee Yeoul Yoo et al. "Novel Die Attach Adhesive for Thin Quad Flat Package", Material & Process Development Department, R&D Center, Anam Semiconductor, Inc., Seoul, Korea.

* cited by examiner

*Primary Examiner* — Benjamin Sandvik
*Assistant Examiner* — Whitney T Moore
(74) *Attorney, Agent, or Firm* — Fox Rothschild LLP

(57) ABSTRACT

Embodiments of light sources are disclosed herein. An embodiment of the light source comprises a lead frame having a first side and a second side. A hole extends through the lead frame between the first side and the second side. An adhesive is located in the hole and extends beyond the hole, wherein the adhesive extends beyond the diameter of the hole on the first side and the second side of the first lead frame. A light emitter adhered to the adhesive proximate the first side of the first lead frame.

17 Claims, 3 Drawing Sheets

LIGHT EMITTER

BACKGROUND

Many light sources include a light emitter, such as a light-emitting diode, attached to a lead frame. The light emitter is then encapsulated. The light sources are subject to failure if the light emitter detaches from the lead frame. Detachment may occur if the encapsulant moves relative to the lead frame. For example, heating and cooling of the light source may cause the movement.

DETAILED DESCRIPTION

Figure 1:
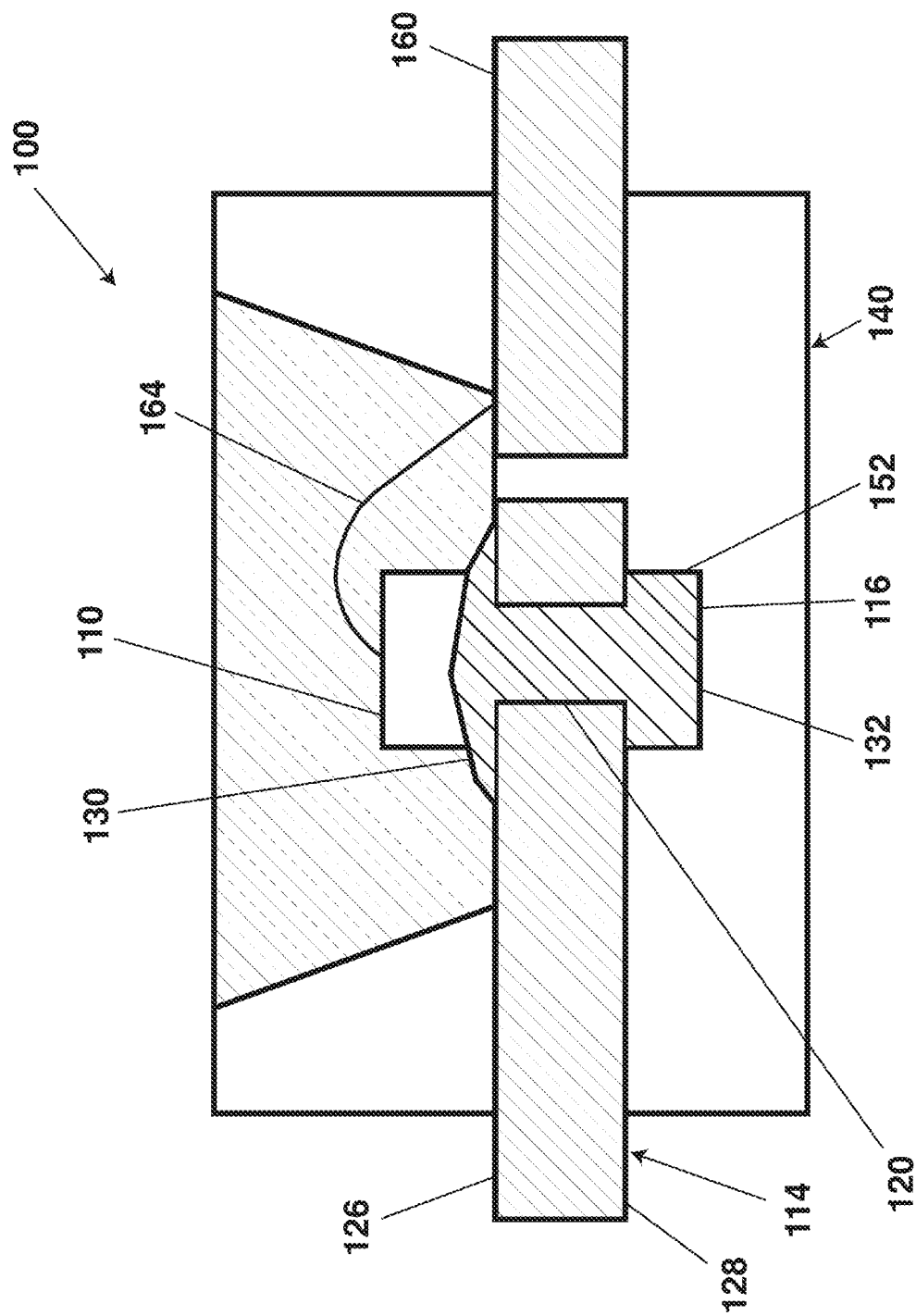
FIG. 1 is a side cut away view of an embodiment of a light source.

A side cut away view of a light source 100 is shown in FIG. 1. In summary, the light source 100 uses a unique approach to adhere a light emitter 110 to a first lead frame 114. More specifically, an adhesive 116 extends through a hole 120 in the first lead frame 114 to provide additional anchoring for the light emitter 110.

The first lead frame 114 has a first side 126 and a second side 128 located opposite the first side. The hole 120 extends between the first side 126 and the second side 128. The first lead frame 114 may be made of an electrically conductive material so as to conduct electricity to the light emitter 110.

The adhesive 116 extends through the hole 120, which enhances its ability to secure the light emitter 110 to the first lead frame 114. The adhesive 116 may be an electrically conductive compound that is substantially rigid. The adhesive 116 may also cure and become substantially rigid after a curing process or time. In the embodiment of FIG. 1, the adhesive 116 has a first volume 132 that extends beyond the radius of the hole 120. The first volume 132 may be adhered to the first side 126 of the first lead frame 114. The adhesive 116 may substantially fill the hole 120 and may be adhered to the circumference of the hole 120. A second volume 132 of adhesive 116 may be located adjacent the second side 128 of the first lead frame 114. The second volume 132 may have a diameter that is greater than the diameter of the hole 120.

As shown in FIG. 1 and as described above, the diameters of the first volume 132 and the second volume 132 may be greater than the diameter of the hole 120. This configuration of the adhesive 116 locks the adhesive in the hole 120, which serves to improve its adhesion to the first lead frame 114. Therefore, the adhesive 116 is not likely to peel or otherwise separate from the first lead frame 114.

The light emitter 110 may be adhered to the first lead frame 114 by the adhesive 116. More specifically, the light emitter 110 may be adhered to the first lead frame 114 by attaching the light emitter 110 to the first volume 130. The attachment of the light emitter 110 to the first lead frame 114 via the adhesive 116, which is secured to the first lead frame 114, enhances the attachment of the light emitter 110 to the first lead frame 114. Therefore, the light emitter 110 is less likely to move relative to or become detached from the first lead frame 114.

In some embodiments, the adhesive 116 is electrically conductive and the adhesive contacts a conductor of the light emitter 110. This contact creates an electrical path between the first lead frame 114 and the light emitter 110. It is noted that in some embodiments, the adhesive 116 may not be conductive, which requires other methods of electrically connecting the light emitter 110 to the first lead frame 114.

Figure 2:
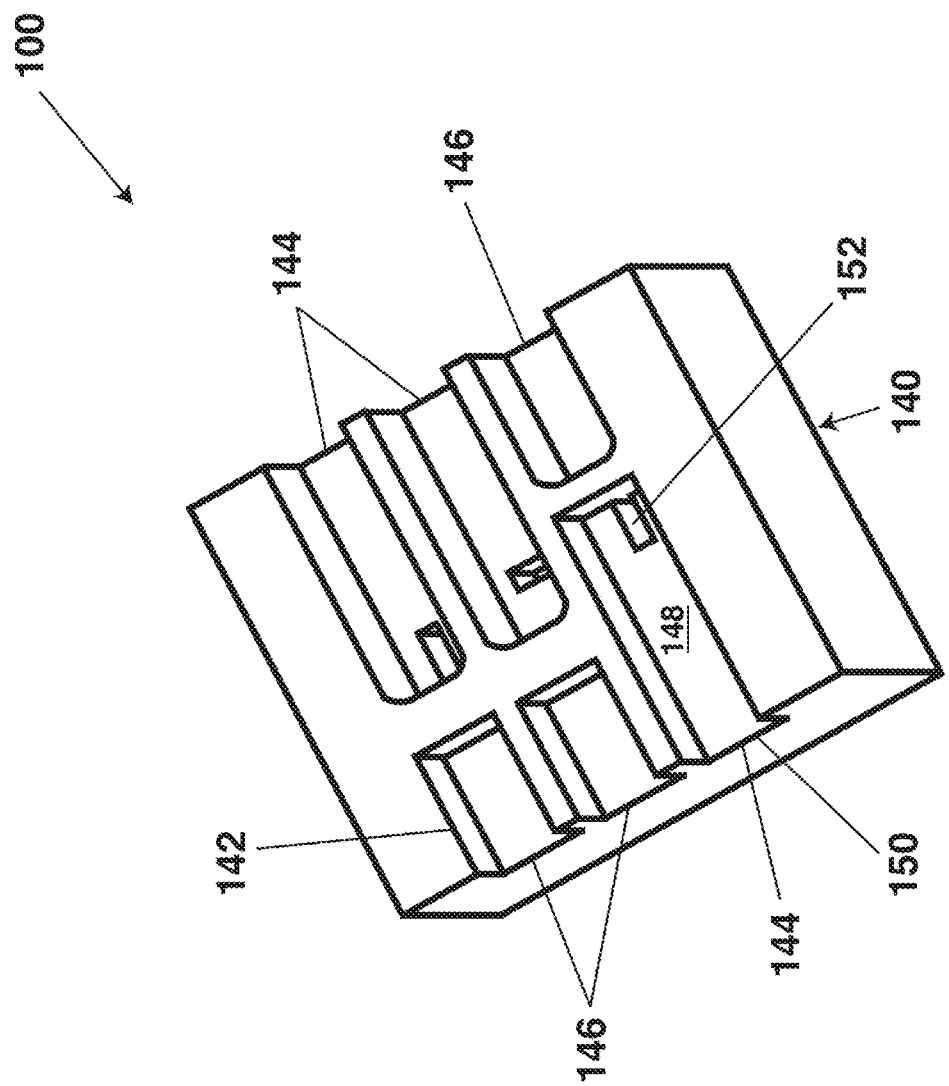
FIG. 2 is a side perspective view of the lower substrate of FIG. 1.

With additional reference to FIG. 2, the first lead frame 114 may be mounted into or onto a substrate 140. FIG. 2 is a top perspective view of the substrate 140 without any lead frames attached thereto. The substrate 140 may be adapted to receive a plurality of lead frames that may be substantially similar to the first lead frame 114. In the embodiments of FIG. 1 and FIG. 2, the substrate 140 has a plurality of channels 142 formed therein.

The embodiments of the substrate 140 described herein have two types of channels 142. A first plurality of channels 144 is adapted to receive lead frames such as the first lead frame 114. A second plurality of channels 146 is adapted to receive conventional lead frames or leads. The first channels 144 each have a surface 148 onto which a first lead frame 114 is set.

As described above, the first lead frame 114 has a second volume 132 of adhesive 116 extending from the second side 128. Therefore, the first channels 144 have to be adapted to receive the second volume 132. Reference is made to a channel 150, which is substantially similar to all the first channels 144. The channel 150 has a cavity 152 formed in the surface 148. The cavity 152 is sized to receive the second volume 132 of adhesive 116. The cavity 152 enables the first lead frame 114 to set on the surface 148 without rocking or becoming unstable.

Figure 3:
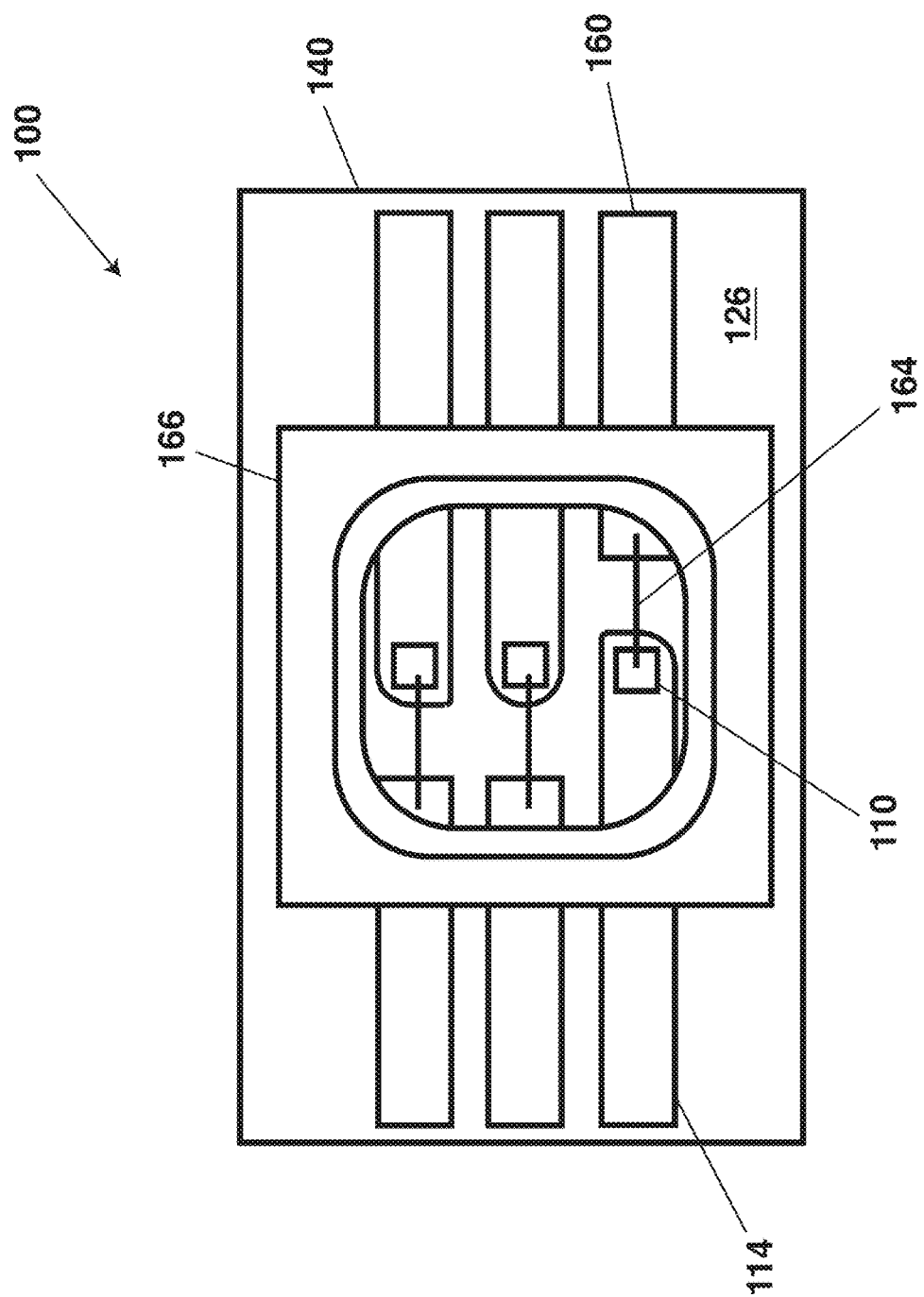
FIG. 3 is a top plan view of and embodiment of the completed light source of FIG. 1.

A top plan view of an embodiment of the complete light source 100 is shown in FIG. 3. A second lead frame 160 is located in the channel opposite the channel 150. The second lead frame 160 may be a conventional type lead frame that is received in a second channel 146. A wire 164 connects the LED 110 to the second lead frame 160. Thus, an electrical circuit is complete between the first lead frame 114 and the second lead frame 160 by way of the LED 110 and the wire 164. It is noted that the substrate 140 may contain a plurality of lead frames and LEDs that operate independent of each other.

A lens 166 may be placed over the substrate 140. The lens 140 may have a frame or the like that serves to physically hold the lead frames in their respective channels. The lens 166 may also include an opening to allow for an encapsulant to fill the volume above the substrate 140.

Several different methods of manufacturing the light source 100 may be used. In some embodiments, the first lead frame 114 may be manufactured as described above. More specifically, the first lead frame 114 may have the hole 120 formed therein. The LED 110 may then be attached to the first lead frame 114 by use of the adhesive 116 as described above. The completed first lead frame 114 along with the other lead frames may then be attached to the substrate 140 so that the second volume 132 of adhesive 116 is in the cavity 152.

In another embodiment, the first lead frame 114, without the LED 110 attached thereto, may be placed in the channel 150. The first lead frame 114 is placed in the channel 150 so that the hole 120 is adjacent the cavity 152. After the first lead frame 114 is in place, the adhesive 116 is injected into the hole 120. The adhesive 116 fills the cavity 150 so as to form the second volume 132. The hole 120 is filled to also form the first volume 130. The LED 110 may then be affixed to the first volume 130 in a conventional manner. The lens 166 may then be attached to the substrate 140.

In some embodiments, the cavity 152 extends beyond the width of the first lead frame 114. The wider cavity 152 provides for better filling of the cavity 152. More specifically, air can escape from the cavity 152 as it is being filled.

What is claimed is:

1. A light source comprising:
a first lead frame having a first side and a second side;
a hole extending through said first lead frame between said first side and said second side;
an adhesive located in said hole and extending beyond said hole, wherein said adhesive extends beyond the diameter of said hole on said first side and said second side of said first lead frame;
a light emitter adhered to said adhesive proximate said first side of said first lead frame, and
a second lead frame located proximate said first lead frame, wherein an electrical circuit extends between said first lead frame and said second lead frame by way of said light emitter.

2. The light source of claim 1 and further comprising a substrate, wherein said first lead frame is attached to said substrate.

3. The light source of claim 2, wherein said substrate comprises a channel and wherein said first lead frame is located in said channel.

4. The light source of claim 3, wherein said channel comprises a recessed portion located proximate said hole in said first lead frame, and wherein at least some of said adhesive is receivable in said recessed portion.

5. The light source of claim 2, wherein the first lead frame does not fully cover said recessed portion.

6. The light source of claim 2, wherein said substrate comprises a recessed portion located proximate said hole in said first lead frame, and wherein said adhesive is receivable in said recessed portion.

7. The light source of claim 2, wherein said adhesive is adhered to said substrate.

8. The light source of claim 2 and further comprising a lens affixed to said substrate.

9. The light source of claim 1 and further comprising a wire extending between said light emitter and said second lead frame.

10. The light source of claim 1 and further comprising a lens.

11. A light source comprising:
a first lead frame having a first side and a second side;
a hole extending through said first lead frame between said first side and said second side;
a substrate having a channel, wherein said first lead frame is receivable in said channel;
an adhesive located in said hole of said first lead frame and extending beyond said hole, wherein said adhesive extends beyond the diameter of said hole on said first side and said second side of said first lead frame;
a light emitter adhered to said adhesive proximate said first side of said first lead frame; and
a second lead frame located proximate said first lead frame, wherein an electrical circuit extends between said first lead frame and said second lead frame by way of said light emitter.

12. The light source of claim 11, wherein said channel comprises a recessed portion located proximate said hole in said first lead frame, and wherein at least some of said adhesive is receivable in said recessed portion.

13. The light source of claim 11, wherein said adhesive is adhered to said substrate.

14. The light source of claim 11 and further comprising a wire extending between said light emitter and said second lead frame.

15. The light source of claim 11, wherein said channel comprises a recessed portion located proximate said hole in said first lead frame, and wherein the first lead frame does not fully cover said recessed portion.

16. The light source of claim 11 and further comprising a lens adhered to said substrate.

17. A light source comprising:
a first lead frame having a first side and a second side;
a hole extending through said first lead frame between said first side and said second side;
a substrate having a channel and a recessed portion located within said channel, wherein said first lead frame is receivable in said channel;
an adhesive located in said hole of said first lead frame and extending beyond said hole, wherein said adhesive extends beyond the diameter of said hole on said first side and said second side of said first lead frame, and wherein at least a portion of said adhesive is receivable in said recessed portion; and
a light emitter adhered to said adhesive proximate said first side of said first lead frame
wherein said substrate comprises a second channel having a second lead frame located therein and wherein said second lead frame is electrically connected to said first lead frame.

* * * * *